US012621971B2

(12) United States Patent
Brandley et al.

(10) Patent No.: US 12,621,971 B2
(45) Date of Patent: May 5, 2026

(54) STRUCTURAL COMPOSITES WITH ELECTROMAGNETIC COMPATIBILITY FOR BATTERY ENCLOSURES

(71) Applicant: BRIDGESTONE AMERICAS, INC, Nashville, TN (US)

(72) Inventors: Mark W. Brandley, Nashville, TN (US); Yousof Azizi, Akron, OH (US); Denis Schmitz, Munich (DE); Markus Freiberger, Munich (DE); Adam J. Halsband, Munich (DE)

(73) Assignee: Bridgestone Americas, Inc., Nashville, TN (US)

( * ) Notice: Subject to any disclaimer, the term of this patent is extended or adjusted under 35 U.S.C. 154(b) by 28 days.

(21) Appl. No.: 18/724,713

(22) PCT Filed: Nov. 9, 2022

(86) PCT No.: PCT/US2022/079514
§ 371 (c)(1),
(2) Date: Jun. 27, 2024

(87) PCT Pub. No.: WO2023/129771
PCT Pub. Date: Jul. 6, 2023

(65) Prior Publication Data
US 2025/0071959 A1 Feb. 27, 2025

Related U.S. Application Data

(60) Provisional application No. 63/294,503, filed on Dec. 29, 2021.

(51) Int. Cl.
*H05K 9/00* (2006.01)
*H01M 50/229* (2021.01)
(Continued)

(52) U.S. Cl.
CPC ........ *H05K 9/0047* (2013.01); *H01M 50/229* (2021.01); *H01M 50/24* (2021.01);
(Continued)

(58) Field of Classification Search
CPC .................................................... H05K 9/0083
See application file for complete search history.

(56) References Cited

U.S. PATENT DOCUMENTS 11,084,386 B2 * 8/2021 Howard ................... B60K 1/04
2015/0330724 A1 * 11/2015 Tanaka ................ H05K 9/0083
428/105

(Continued)

FOREIGN PATENT DOCUMENTS

CN 208637466 U 3/2019
CN 110299476 A 10/2019
(Continued)

OTHER PUBLICATIONS

International Search Report and Written Opinion issued in corresponding International PCT Application No. PCT/US2022/079514; Dated: Mar. 15, 2023.

*Primary Examiner* — Hung V Ngo
(74) *Attorney, Agent, or Firm* — Shaun J. Fox; J. Gregory Chrisman

(57) ABSTRACT

A molded composite battery enclosure containing top and bottom composite covers attached together. The joined top and bottom composite cover structures form an enclose or open area for housing a battery system of battery cells and cooling devices. The composite battery enclosures are lightweight and made of materials that can function to absorb energy and insulate the battery housing area. The composite structures contain a core material adhered and sandwiched (Continued)

between skin fiber layers and an electromagnetic shielding material or resin incorporated into one of the composite structures.

14 Claims, 2 Drawing Sheets

(51) Int. Cl.
H01M 50/24 (2021.01)
H01M 50/242 (2021.01)
H01M 50/28 (2021.01)

(52) U.S. Cl.
CPC ......... H01M 50/242 (2021.01); H01M 50/28 (2021.01); H05K 9/0083 (2013.01); *H01M 2220/20* (2013.01)

(56) References Cited

U.S. PATENT DOCUMENTS

| | | | |
|---|---|---|---|
| 2016/0207636 A1* | 7/2016 | Yokoi | B64D 45/00 |
| 2022/0294058 A1* | 9/2022 | Brandley | H01M 50/231 |

FOREIGN PATENT DOCUMENTS

| | | |
|---|---|---|
| CN | 212571205 U | 2/2021 |
| EP | 3706193 A1 | 9/2020 |
| WO | 2021034420 A1 | 2/2021 |

* cited by examiner

STRUCTURAL COMPOSITES WITH ELECTROMAGNETIC COMPATIBILITY FOR BATTERY ENCLOSURES

TECHNICAL FIELD

The present disclosure relates to structural composites for use as battery enclosures and, in particular, to structural composites having electromagnetic compatibility features for use as a battery enclosure for electric vehicles or equipment.

BACKGROUND

Vehicles powered by electric batteries have grown in popularity with users. These vehicles allow a user the ability to charge the batteries at their place of residence or at a charging station and avoid the cost of purchasing gasoline. To supply the power needed to reach long distances, these vehicles need large capacity batteries. However, these large capacity batteries pose an increased risk to occupants and emergency responders if the batteries are damaged during a collision. The batteries need to be protected from the force generated during the collision or alternatively, any force transmitted to the batteries must be low enough so as not to cause significant damage to the batteries.

The present disclosure provides battery enclosures that are strong and light weight, as compared to battery enclosures known previously. The enclosures utilize composite materials, optionally with structural electromagnetic compatibility features, to protect the batteries and operating systems in the enclosure from electromagnetic signals and harmful interference. The electromagnetic compatibility features of the battery enclosures protect any internal housed equipment from adverse influence or potential damage by electromagnetic radiation and intrusion from outside electromagnetic sources or closely positioned equipment, even over a range of possible frequencies.

SUMMARY

In a first aspect, disclosed is a composite battery enclosure with electromagnetic shielding properties that includes a molded top composite cover having a first core sandwiched between a first top composite cover skin and a second top composite cover skin; and a molded bottom composite cover having a second core sandwiched between a first bottom composite cover skin and a second bottom composite cover skin. The molded top composite cover, the molded bottom composite cover, or both, include an electromagnetic shielding resin matrix, the electromagnetic shielding resin matrix including a dispersed conductive filler.

In a second aspect, there is a composite battery enclosure with electromagnetic shielding properties that includes a molded top composite cover having a first core sandwiched between a first top composite cover skin and a second top composite cover skin; and a molded bottom composite cover having a second core sandwiched between a first bottom composite cover skin and a second bottom composite cover skin. The molded top composite cover, the molded bottom composite cover, or both, include a layer of electromagnetic shielding material, the electromagnetic shielding material including a dispersed conductive filler.

Any one of the above aspects (or examples of those aspects) may be provided alone or in combination with any one or more of the examples of that aspect discussed above; e.g., the first aspect may be provided alone or in combination with any one or more of the examples of the first aspect discussed above; and the second aspect may be provided alone or in combination with any one or more of the examples of the second aspect discussed above; and so-forth.

Additional features and advantages will be set forth in the detailed description which follows, and in part will be readily apparent to those skilled in the art from that description or recognized by practicing the embodiments as described herein, including the detailed description which follows, the claims, as well as the appended drawings.

It is to be understood that both the foregoing general description and the following detailed description are merely exemplary, and are intended to provide an overview or framework to understanding the nature and character of the claims. The accompanying drawings are included to provide a further understanding, and are incorporated in and constitute a part of this specification. The drawings illustrate one or more embodiments, and together with the description serve to explain principles and operation of the various embodiments. Directional terms as used herein—for example, up, down, right, left, front, back, top, bottom—are made only with reference to the figures as drawn and are not intended to imply absolute orientation.

BRIEF DESCRIPTION OF THE DRAWINGS

The above and other features, examples and advantages of aspects or examples of the present disclosure are better understood when the following detailed description is read with reference to the accompanying drawings, in which.

DETAILED DESCRIPTION

Figure 1:
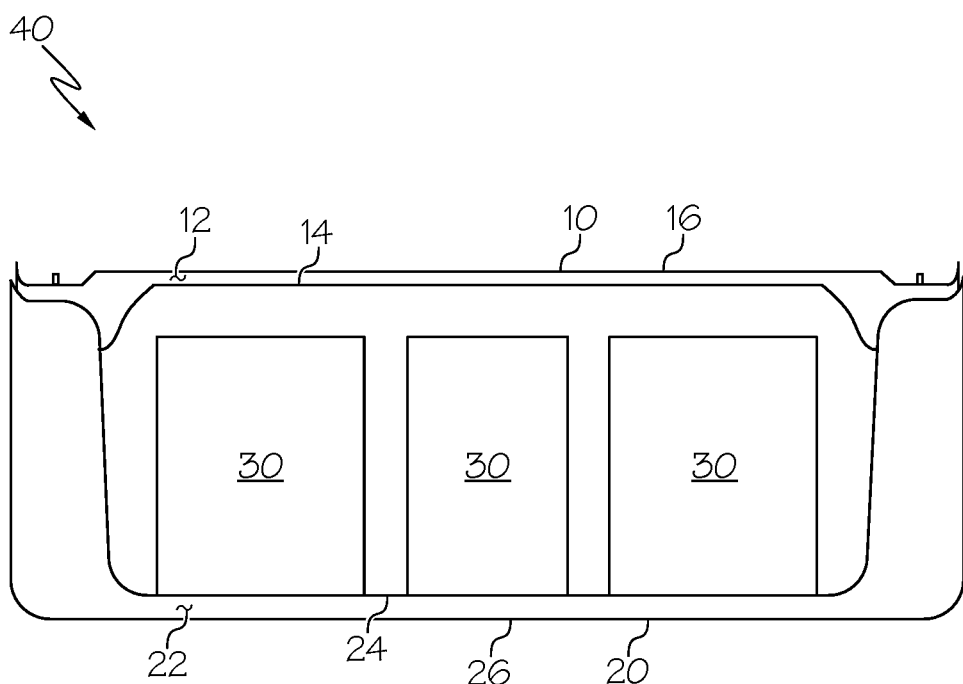
FIG. 1 shows a cross-section view of a two-piece battery enclosure including a molded upper composite cover and a molded bottom composite cover with a battery retaining area.

The terminology as set forth herein is for description of the embodiments only and should not be construed as limiting the invention as a whole.

Herein, when a range such as 5-25 (or 5 to 25) is given, this means preferably at least or more than 5 and, separately and independently, preferably less than or not more than 25. In an example, such a range defines independently 5 or more, and separately and independently, 25 or less.

The terms "substantial," "substantially," and variations thereof as used herein are intended to note that a described feature is equal or approximately equal to a value or description. For example, a "substantially planar" surface is intended to denote a surface that is planar or approximately planar. It also is noted that the terms "substantially" and "about" may be utilized herein to represent the inherent degree of uncertainty that may be attributed to any quantitative comparison, value, measurement, or other representation. These terms are also utilized herein to represent the degree by which a quantitative representation may vary from a stated reference without resulting in a change in the basic function of the subject matter at issue.

The present disclosure relates to composite battery enclosures that can be used in a variety of applications. For example, the composite battery enclosures can be used to house battery systems and related accessories for mechanical equipment and in automotive applications (e.g., passenger vehicle, car, truck, bus, tractor, all-terrain vehicle). In some embodiments, the composite battery enclosure can house a battery system for electric and hybrid vehicles. The composite battery enclosure can be modular and contain multiple pieces connected or attached to one another to form a complete enclosure or box.

The composite battery enclosures can generally have increased shielding effectiveness to electromagnetic emissions and are relatively lightweight. In one or more embodiments, the composite battery enclosures can have one or more components having electromagnetic compatibility properties and include a conductive element. The composite battery enclosures can have a cover, or combination of covers enclosing a battery storage area with an electrically conductive coating or filler such that encountered electromagnetic interference signals are substantially absorbed, reflected, or generally attenuated. In another example, a core material of one or more covers can include an electrically conductive coating or filler for providing electromagnetic shielding.

In yet another example, the composite battery enclosures can have one or more modified components with a conductive filler or blend of fillers, such as a fiber-containing layer or skin, optionally at least partially adhered to a core structure or material, for attenuating electromagnetic interference. Other advantages of the composite battery enclosure covers and cores having electromagnetic compatibilities include being easily formable into a desirable shape by conventional molding methods that preferably use low or moderate pressure and heat, which advantageously lowers time and cost to manufacture the structures. Utilizing a filler, or blend of fillers, reduces the need for additional metal plates or other metallic components that increase the number of layers and complexity of the battery enclosure.

For assembly of the battery enclosure having electromagnetic shielding component, the individual composite components can be attached to one another by conventional methods, for example, using an adhesive or epoxy, a fastener (e.g., screw, bolt, clip), welding, a sealing material, or a combination thereof. For a chemical bond or attachment means between composite components of the battery enclosure, any suitable adhesive can be used, for example, an epoxy. The adhesive can be applied to an outer surface of a composite cover or both covers, such as an exposed surface of fiber layer or an outer perimeter flange section. It is preferable that the composite covers, upper and bottom, are permanently attached to one another to ensure structural integrity of the modular composite structure during use. Other fasteners or attachment fixtures can be used in place of an adhesive, for example, a screw, snap fitting, rivet, clamp, bolt or clip.

To simplify the manufacturing process, the individual composite structures of the battery enclosure, such as a molded bottom and top or upper composite cover including conductive fillers for electromagnetic shielding, can have similar components that can be made of the same or substantially similar materials. For example, the composite covers can have a fiber-containing layer at least partially adhered to a core structure or material, which can optionally have a select multi-thickness area or regions therein, for example, at or near the connection point between the covers. The fiber layers of various individual composite covers can be made of the same or similar materials to reduce material and manufacturing costs, as well as being loaded with the same conductive filler or blend of fillers.

One or more embodiments further include methods for fabricating and manufacturing individual and modular composite battery enclosures. For example, a fiber layer can be positioned or applied on a surface or multiple surfaces of a core material (e.g., a first surface) to form a blank. A second fiber layer can be positioned on a second surface of the core material. Attachment devices can optionally be positioned below or on the fiber layers, for example, in cut out areas in the fiber layers. A curable material (e.g., resin) can be sprayed, poured, spread, rolled, brushed or calendared onto the fiber layers and reinforcement fibers to coat and embed the fibers in the curable material to form a pre-form composite. Under heated conditions, the pre-form composite can be molded (e.g., in a compression or press mold or similar tooling) to form the final shape of the composite battery enclosure. The formed fiber and resin layers sandwiching the core material, upon curing, represent the top and bottom skin covers for the molded composite top composite cover or the molded bottom composite cover that form the battery enclosure.

To impart electromagnetic shielding properties to one or more of the cover skins, a conductive filler, or blend of fillers, can be incorporated into the curable material that is applied to the fibers to form a pre-form composite cover skin. It is preferable that the conductive filler be well dispersed in the curable material to provide a substantially continuous distribution of conductive filler along the entire dimensions of a cover skin. Large areas void of conductive fillers in a cover skin can disadvantageously allow electromagnetic waves to pass through a cover skin. The electrically conductive filler can be dispersed in a curable material or solvent, for example, by mixing the electrically conductive filler with components of the material. The mixing or stirring conditions may be appropriately selected so as to form a uniform distribution of the electrically conductive filler in the material. For example, the curable materials can be obtained by mixing the resins or polymers and other components with the electrically conductive fillers, and other fillers, rubber auxiliaries or the like in conventional mixers, such as rollers, internal mixers and mixing extruders.

As noted above, one or more components of the battery enclosure (e.g., cover skin or core material) are formed from a curable material that includes electrically conductive filler, for example, electrically conductive particles that impart a conductive property to the material to promote attenuation of electromagnetic interference. Such a curable material having conductive filler, or blend of fillers, is referred to as an electromagnetic shielding resin matrix. Electrically conductive particles can be used interchangeably with electrically conductive powder herein. The shape of the particles can be spherical, needle shaped or needle like, fiber like, plate-like or hexagonal or appear flaky or irregular or amorphous.

The curable material (e.g., resin) can include 0.1 to 10 weight percent of the conductive filler, whether a single type of filler or a blend of fillers, based on the total weight of the battery enclosure component that the conductive filler is incorporated, for example, a cover skin or core material. In one or more embodiments, the total conductive filler can be present in a curable material in the range of 0.1 to 10, and preferably 0.5 to 5 weight percent of the total weight of the curable material present in the particular battery enclosure component. In other embodiments, the total conductive filler can be present (i.e. above 0 weight percent) in a curable material up to 10, preferably up to 5 weight percent of the total weight of the curable material present in the particular battery enclosure component.

The conductive filler particles can have an average particle size in the range of 0.1 to 10, 0.2 to 5 or 0.3 to 2 microns. The average particle size of the electrically conductive filler can be less than 5, 3, 2, 1 or 0.5 micron. In one embodiment, the electrically conductive filler can be nanoparticles, for example, the average particle size of the electrically conductive nanoparticles can be in the range of 5 to 100 nanometers (nm), or less than 80, 60, 40, 20 or 10 nm.

In one or more embodiments, the conductive filler or particles of the curable material can be metallic. The curable material may be free, substantially free or contain less than 5 weight percent of other non-metal fillers or non-metal electrically conductive particles based on the total weight of curable material in the battery enclosure component. The electrically conductive fillers can include nickel, copper (e.g., annealed), zinc, tin, iron, aluminum, silver, brass, silver coated copper, silver coated nickel, silver coated aluminum, silver coated tin, silver coated gold; nickel coated copper, nickel coated silver; silvered glass; metal coated: glass (e.g., metallized glass fibers or spheres), ceramics, plastics, elastomers, and mica, and combinations thereof. The fillers can be metal alloys of two or more metals, or composites in which one or more metals are coated on another metal or carrier substrate or core. Metals that are subject to oxidation can be used as the metallic fillers, or alternatively, a conductive corrosion-resistant coating can be applied to prevent oxidation. Of the metals, aluminum, copper, zinc or steel are preferred. The metal fillers, for example, may be used in the form of powders, filings, drillings, flakes, fibers and ribbon.

The filler particles employed in the curable material are generally conductive by virtue of being metal or at least a surface constituted by a metal (e.g., a noble metal), for example, silver, copper or nickel. Preferably, if present, inert cores of the particles, for example the portions beneath the outer surface of the particles, can also contain a metal, which can be the same metal as a surface coating, to promote a high electrical conductivity. Purity of the electrically conductive fillers of the present disclosure is not specifically limited, but preferably 90% by weight or more, 95% by weight or more and preferably 99% by weight or more.

In one or more embodiments, the electrically conductive filler can include electrically conductive carbon black, for example, furnace blacks, acetylene blacks, channel blacks and thermal blacks. For example, the electrically conductive carbon black can have a DBP absorption value of at least 250 ml/100 g and a BET surface area oft least 500 m²/g. For carbon blacks, small nodule sizes and nano particles are preferred. Because of greater conductivity, fine particle size carbon black powders are generally more desirable, however, carbon black fibers may also be used or employed for added strength and reinforcement.

In one or more embodiments, the conductive filler can include conductive carbon fibers, which can be randomly oriented in the curable material by means of mixing. The carbon fibers may be used as chopped fibers, with preference being given to the use of chopped carbon fibers having a length of 0.1 to 50 mm, preferably of 1 to 12 mm, and a diameter of 5 to 40 μm, or preferably of 5 to 10 μm. In another example, the carbon fibers can be metal-coated non-woven fibers, such as nickel coated carbon fibers.

In other embodiments, the conductive fillers can include graphite or graphene, which like carbon black, can be available in different particle sizes and shapes. Any of the commercially available grades may be used, including powders, flakes, crystals, fibers, and the like. Granular or powdered grades are generally preferred, including those with greater surface areas.

The curable material including conductive filler as applied to fibers in the cover skins or core is molded to form the final composite cover. Molding conditions such as temperature and pressure can be adjusted as needed but are preferably low to moderate to reduce time and cost of manufacturing the composite battery enclosure. For example, the enclosure can be heated during molding to a temperature in the range of about 100° to about 200° C., about 110° to about 190° C., about 120° to about 180° C., or about 130° to about 160° C. In another example, the enclosure can be subjected to pressure during molding in a range of about 0.1 megapascal (MPa) to about 1 MPa, about 0.15 to about 0.8 MPa, or about 0.2 to about 0.6 MPa.

The molding process can form areas of varying thickness in the composite battery enclosure that selectively increase or reduce thickness of the core material, for instance, near a connection point, at a bend area or to form a recess, indentation, channel or groove. In the embodiments that include a honeycomb as the core material, sections of the honeycomb core can be crushed or partially crushed where thickness is reduced (e.g., at corners, edges, transition areas, recesses, channels, etc.). In one or more embodiments, it is desirable to utilize a thermoplastic material (e.g., polycarbonate) as the core material. For example, a thermoplastic core material can be melted under heated mold conditions and varying thickness can be achieved without changing the integrity of the material.

In some embodiments, the fiber layers or skins can extend past the core material and join together to form flanges void of any composite material therebetween, for example, at the perimeter of the top and bottom covers. These multilayer sections (e.g., two fiber skins adjoined together) can be referred to as a monolithic portion or section as opposed to a sandwich composite that contains a core material between two fiber layers. These monolithic flanges can be formed in the molding process to any desired shape to align the flanges together, for example, to nest them together. The aligned monolithic flange portions of the covers can assist in assembly and alignment of the covers together in addition to providing additional stiffness and resistance to movement of the covers relative to one another. The monolithic sections of the molded composite covers preferably include a curable resin having the dispersed conductive filler.

The molded composite covers can be cleaned to remove debris or any excess material from the surface. Cleaning can be carried out with conventional methods, for example, pressurized gas or air can be blown on the composite covers to dislodge debris, such as dust or particles, that is adhered to the surface. The composite covers can also be brushed or wiped to remove unwanted material. In another example, the covers can be brought into contact with a cleaning solution, which can dissolve residue (e.g., release agents) from the surface of the cover. For instance, an aqueous solution with a cleaning agent (e.g., a surfactant) can be used. A cleaning solution can applied to the surface of the composite covers by any suitable method such as spraying, dipping or brushing.

The steps of trimming and cleaning prepare the composite battery enclosure for downstream processes if desired. In some embodiments, the composite battery enclosure can have additional coatings applied to its surface, such as an overcoat or protective coating (a fire, smoke and toxicity (FST) material, fire-retardant material or resin). In other embodiments, the composite battery enclosure can be painted for its final application, for example, installation in an electric or hybrid vehicle.

In another embodiment of the present disclosure, prior to molding, a cover skin and/or core material can be coated or include a layer of electromagnetic shielding material that can be subjected to the molding of the composite cover to form a final composite cover component. The layer of electromagnetic shielding material can be used with, or without, the above-described electromagnetic shielding resin matrix or curable material depending on the level of electromagnetic attenuation that is desired.

The electromagnetic shielding material can be applied to one or more surfaces of a pre-molded cover skin or core material, for example, the material can be sprayed, poured, spread, painted, rolled, brushed or calendared onto the surface to form a coat or layer of the material. In other examples, a layer of electromagnetic shielding material can be deposited, for example, in a depositing bath, plating or electroplating process. The electromagnetic shielding material includes a conductive filler, or blend of fillers, as described above for the electromagnetic shielding resin matrix. The electromagnetic shielding material can include 0.1 to 10 weight percent of the conductive filler, whether a single type of filler or a blend of fillers, based on the total weight of the final electromagnetic shielding layer or coating. In other embodiments, the content or concentration of the conductive filler can be measured in the electromagnetic shielding material prior to being applied to the surface of a pre-molded cover skin or core material. For example, the electromagnetic shielding material can include 0.5 to 5 weight percent of the conductive filler based on the total weight of the electromagnetic shielding material itself prior to application to a surface of a battery enclosure component.

In one or more embodiments, the layer of electromagnetic shielding material forms an outermost surface of one or more cover skins, a core material, or a combination thereof. To prevent unwanted wear and reduction in performance, the electromagnetic shielding material layer cannot be an outermost layer of the battery enclosure, but rather forms an internal layer, for example, positioned between a cover skin and a core material of a composite cover. In other embodiments, the layer of electromagnetic shielding material can be integrated in one or more layers of a curable resin used to form a portion of a cover skin or core material. To arrive at a desired thickness of the layer of electromagnetic shielding material, one or more layers of the material can be applied in sequence, for example, 2, 3 or 4 layers of electromagnetic shielding material. The electromagnetic shielding material can have a thickness in the range of 0.5 mm to 8 mm, or 1 mm to 5 mm.

For ease of applying the material, the electromagnetic shielding material can further include a liquid carrier or solvent, for example, in an organic solvent or water containing 1 to 10 weight percent of a conductive filler and remaining amount of materials that make up the electromagnetic shielding material.

Once the desired battery enclosure components are formed with the electromagnetic shielding resin matrix, one or more layers of electromagnetic shielding material, or any combination thereof, assembly of the composite battery enclosure and related components can be carried out by positioning the bottom composite cover and then inserting the desired battery system. Battery cells can be mounted over a cooling system, if present, followed by connection of all electrical cables. If desired, a perimeter seal is positioned on the bottom composite cover before placing the top composite cover over the bottom cover. Attachment means, for instance adhesive or fixtures (e.g., screws), are used to secure the top and bottom composite covers together before mounting the assembled composite battery enclosure in the desired application such as an electric vehicle.

Turning to the figures, FIG. 1 shows a two-piece composite battery enclosure 40 that includes a molded top composite cover 10 and a molded bottom composite cover 20, which can be attached to one another at an interface area to provide a battery enclosure area. As shown, molded bottom composite cover 20 can be designed to house a battery system including a plurality of batteries 30. Any suitable number of batteries can be included in the battery enclosure 40, for instance, for accommodating an electric vehicle power requirement. Enclosure 40 can be a component of a vehicle such that enclosure 40 is secured to other portions or parts of a vehicle, for example, a frame structure. Top and bottom composite covers 10, 20 have core sections 12, 22 arranged between two skins or cover skins 14, 16, 24, 26 (e.g., mixture of curable material and reinforcing fiber). The core sections can extend in a central area of a cover 10, 20 along its entire length as shown and further include portions having an increased in thickness at select regions, for example, along a perimeter edge for providing impact protection, stiffness to the battery enclosure, and resistance to shifting of the covers when contacting a sidewall section of a bottom cover.

Top composite cover 10 has a top skin 16 and a bottom skin 14. As shown in FIG. 1, top skin 16 and bottom skin 14 can include a core material (e.g., honeycomb) sandwiched therebetween and in direct contact with the skins. Bottom composite cover 20 has a top skin 26 and a bottom skin 24, which sandwich core material therebetween that is in direct contact with the skins. In one or more embodiments, the skins 14, 16, 24, 26 can be a fiber in a curable material layer. A skin can contain continuous and/or discontinuous fibers for reinforcement embedded in a curable material to form layers having a substantially uniform thickness. The fibers can be arranged together to form a sheet or mat that can be positioned on a core material.

The reinforcement fibers can be entangled in a random pattern or in a more systematic design, for example, the fibers can be unidirectional/aligned or weaved together in the form of a woven fiber sheet. In other examples, the fibers can be loosely bundled together or pressed together into a mat to form a fiber sheet. Multiple layers of unidirectional fibers can be used, for example, each layer of unidirectional fibers can be arranged at a parallel, angled or perpendicular position relative to an underlying fiber layer. A whole fiber sheet can be used to cover a core material surface (e.g., a top surface). Alternatively, strips or sections of fibers can be applied side by side in a segmented arrangement to cover a core material surface. Examples of fibers that can be used in the fiber layer include carbon fibers, glass fibers, plastic fibers, etc. In one example, an inexpensive fiberglass sheet can be applied to a first surface of a core material.

The fibers can be applied to the surface of a core material to cover an entire face surface of the core material or a portion thereof. In some embodiments, the fibers are arranged on a core material, a polymer forming material or resin (curable material) can be applied onto the fibers. The curable material can penetrate and soak into the fibers arranged on the core material, which can embed or partially embed the fibers in the curable material. As described herein, curable material can be pushed and forced into the fiber layer to embed the fibers during a molding step, for example, a press or compression mold can push curable material into the fibers to coat the fibers, fill voids in the fiber layer and contact the core material. A sufficient amount of curable material can be applied to the fibers to form polymer layer that embeds the fibers and contacts the core material 12, 22 to adhere the fibers to one another and to the core. In one or more embodiments, the curable material can be formed from a curable polymer resin or composition. The composition can include a mixture of components, for example, a thermoset material, a thermoplastic material, a hardener, a catalyst, fillers, and any combination thereof. Materials can include epoxy, polyurethane, polyether ether ketone, polyethylene, or combinations thereof. The composition preferably has a low cure period in the range of 1 to 20 minutes, or less than 15, 10 or 5 minutes. The curable material once cured can bond the fiber layer (e.g., 14, 16, 24, 26) to the core material (e.g., 12, 22) to form a laminate as the composite structure (e.g., 10, 20). The fiber layer preferably bonds or adheres to the core to prevent delamination or separation of the fiber layer from core material. Under heated conditions, the pre-form composite can be molded (e.g., in a compression) mold to form the final shape of the composite structure.

Figure 2:
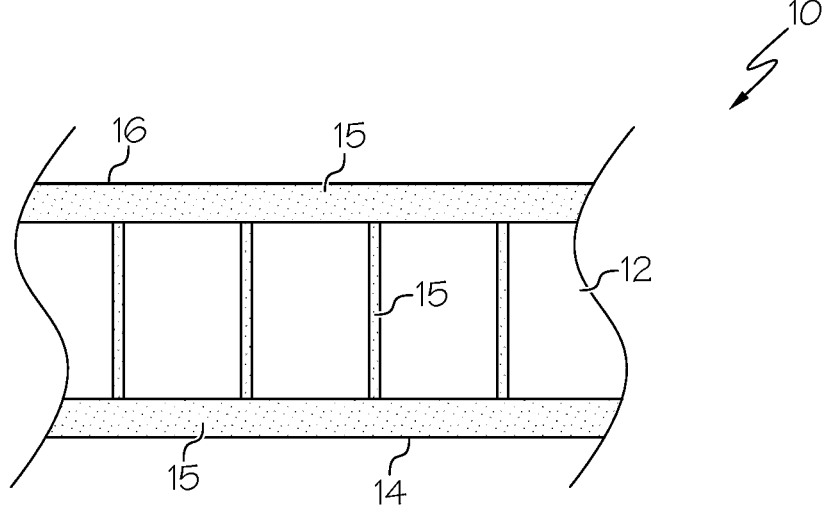
FIG. 2 shows a cross-section view of an example of the molded upper composite cover of the battery enclosure of FIG. 1.

As described herein, the curable material used to form one or more of the cover skins 14, 16, 24, 26 and/or the core material 12 is an electromagnetic shielding resin matrix that includes a conductive filler or blend of conductive fillers to provide the battery enclosure 40 with electromagnetic capabilities. FIG. 2 shows a cross-section of top composite cover 10 of FIG. 1. Top composite cover 10 can include at least one of the top skin 16, bottom skin 14 and core material 12, or any combination of the same, containing an electromagnetic shielding resin matrix 15 containing conductive filler to impart sufficient electrical conductivity such that electromagnetic interference signals are effectively absorbed, reflected or otherwise attenuated. The electromagnetic shielding resin matrix as used in the skins 14, 16 and core material 12 of FIGS. 1 and 2 can be as described above. Although not shown, the electromagnetic shielding resin matrix 15 can be used in the same manner for the bottom composite cover 20 as illustrated in FIG. 2 for the top composite cover 10.

Figure 3:
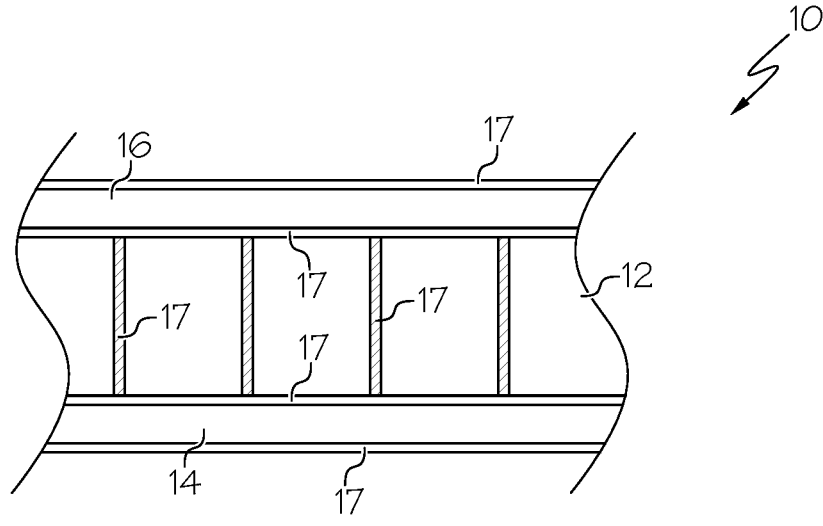
FIG. 3 shows a cross-section view of an example of the molded upper composite cover of the battery enclosure of FIG. 1.

In another embodiment, as shown in FIG. 3, a cross-section of top composite cover 10 of FIG. 1, at least one of the top skin 16, bottom skin 14 and core material 12, or any combination of the same, can include a layer of electromagnetic shielding material 17. As desired, any of the layers of the electromagnetic shielding material 17 can be excluded to adapt the top composite cover 10 to have sufficient conductivity for imparting sufficient electrical conductivity such that electromagnetic interference signals are effectively absorbed, reflected or otherwise attenuated. The one or more layers of electromagnetic shielding material can be applied as discussed above, for instance, by spraying.

As shown, the layer of electromagnetic shielding material 17 can form an outermost surface of a skin 14, 16 or core material 12. For example, the layer of electromagnetic shielding material 17, as directly applied to the outermost surface of skin 16 facing the surrounding environment of the battery enclosure 40, forms the outer surface of the top composite cover 10. In another arrangement, the layer of electromagnetic shielding material 17 can be positioned between, and in direct contact with, the core material 12 and fiber layer of skin 16. As applied to core material 12, the electromagnetic shielding material can coat an outer protective film on one or more sides of the core or cover the interior surface or portions thereof of the core, for example, the surface of cell walls. In the later case, the core material can be dipped or submerged in a bath containing an electromagnetic shielding material of conductive filler. Depending on the core material, the bath containing an electromagnetic shielding material of conductive filler can coat and/or impregnate the core material to form layer 17.

Although not shown, one or more layers of the electromagnetic shielding material 17 can be used in the same manner for the bottom composite cover 20 as illustrated in FIG. 3 for the top composite cover 10.

Figure 4:
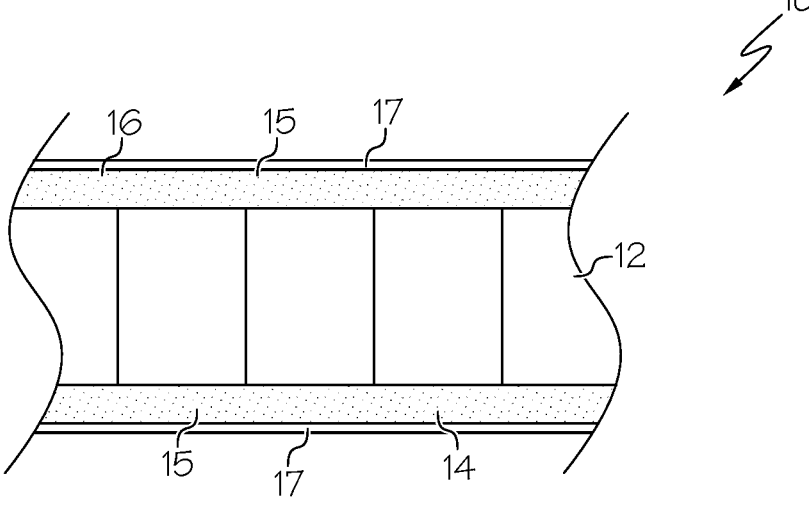
FIG. 4 shows a cross-section view of an example of the molded upper composite cover of the battery enclosure of FIG. 1.

In yet another embodiment, FIG. 4 shows a cross-section of top composite cover 10 of FIG. 1 having a combination of one or more layers of an electromagnetic shielding material of conductive filler and one or more portions of an electromagnetic shielding resin matrix used in the top and bottom skins 14 and 16 to impart sufficient electrical conductivity to the top composite cover 10 for protecting from electromagnetic interference signals. As shown, top skin 16 has an outer surface layer of electromagnetic shielding material 17 exposed to the environment surrounding the battery enclosure. The layer of electromagnetic shielding material 17 is directly applied to the surface of the top skin 16, and is in direct contact with the curable material forming a portion of the top skin 16 along with reinforcing fiber. The curable material of the top skin 16 includes an electromagnetic shielding resin matrix 15 formed by adding conductive filler to the curable material and applying the material to a bed of fibers. In an alternative example, top skin 16 can have the layer of electromagnetic shielding material 17 positioned between the core material 12 and the skin 16, leaving the outside surface of the skin 16 directly exposed to the surrounding environment. In yet another example, top skin 16 can have two layers of electromagnetic shielding material 17 arranged one layer on the outer surface of the top skin 16 and one layer on the inner surface of the top skin 16 facing the core material 12.

Bottom skin 14 of the top composite cover 10 has an outer surface layer of electromagnetic shielding material 17 exposed to the battery housing environment inside the battery enclosure (i.e. facing the batteries). The layer of electromagnetic shielding material 17 directly contacts bottom skin 14 and the curable material forming a portion of the skin 14. The curable material of bottom skin 14 further includes an electromagnetic shielding resin matrix 15 formed by adding conductive filler to the curable material and applying the material to a bed of fibers. Other arrangements of layer 17 can be made that are not shown, for example, layer 17 can be on the opposite surface of skin 14 directly facing the core material 12 or there can be multiple layers of electromagnetic shielding material 17 on both surface sides of skin 14.

For the core sections of the covers disclosed herein, for example cores 12, 22 of the individual composite covers, the core material can be a plurality of open or gas-filled cells defined by cell walls. The cells can have any suitable cross-section shape (e.g., circular, hexagon, square, etc.). For example, the cores can be a honeycomb structure that includes many individual open cells side by side and arranged in the composite structures such that the cell walls are perpendicular to the longitudinal axis of the composite structure or an adjacent fiber layer. Alternatively, the cell walls can be arranged at other angles, for example, parallel or angled relative to the longitudinal axis of the composite structure. The cell walls can be made of plastic, for example, a thermoplastic or thermoset material. In one example, polypropylene or polycarbonate can be used as the material for the core and/or cell walls. The plurality of cells can be molded to form a desired shape wherein a portion of the cells are deformed under pressure, and optionally heat, to reduce the initial thickness of the core material. The cell walls of the core material can be coated with a layer of electromagnetic shielding material 17, made with a portion of an electromagnetic shielding resin matrix, or both, to provide the battery enclosure from electromagnetic interference.

In one or more embodiments, the cores can be a non-cell material and composed any suitable thermoplastic material or curable material, which can include one or more conductive fillers to provide electromagnetic shielding. Examples of thermoplastic materials include, but are not limited to, polypropylene and polycarbonate. The thermoplastic core can be a solid structure without openings such as cells. The thermoplastic core material can be molded under moderate heat and pressure to soften the material and form it into the desired shape having varying thickness. In one example, the thermoplastic material is heated above its glass transition temperature in a molding process to form the desired shape of the structure. The thermoplastic material can be heated, for example in a mold, to have a temperature in the range of about 100° to about 200° C., about 110° to about 190° C., about 120° to about 180° C., or about 130° to about 160° C. After forming the desired structure shape of the core, the thermoplastic material can be cooled to room temperature. In one or more embodiments, the average thickness of the core can be in the range of about 5 to about 250 millimeters (mm), about 5 to about 100 mm, or about 10 to about 50 mm.

The core is preferably easily moldable to arrive at the desired shape for the composite covers. In one or more embodiments, the core can have regions of different thicknesses and angles along its length (e.g., the reinforced area of increased thickness 13). The core material can have properties that provide an energy absorbing and insulating abilities. For example, the core can be a low density, crushable core that deforms upon impact and yet retains mechanical integrity (e.g., stiffness) in normal operation. The open cells and cell walls of a honeycomb core can absorb impact energy as the cell walls collapse and break. Other materials that can absorb energy can include elastomers, thermoplastic material, foams (e.g., open cell, viscoelastic, etc.), paper (e.g., cardboard), or molded resins. These materials can be combined with the plurality of cells, for example, the cells or a portion thereof (e.g., select regions where impact or insulating is desired) can be filled or partially filled with foams or elastomers. In other embodiments, the core material can reduce conductivity as compared to other conventional materials such as steel. In one or more embodiments, the core materials of the composite structures of the present disclosure can include a conducting fiber (e.g., electrical conducting) for providing electromagnetic compatibility properties or behavior of the composite structure. For example, conductive reinforcements (e.g., metal inlay) or conductive wires can be layered in the sandwich composites or woven in fiber layers of the top and bottom composite covers 10, 20. In another example, shielding foil such as aluminum foil or an outer shielding layer such as metal (e.g., copper) veil can be applied to the battery enclosure 40.

While various aspects and embodiments of the compositions and methods have been disclosed herein, other aspects and embodiments will be apparent to those skilled in the art.

The various aspects and embodiments disclosed herein are for purposes of illustration and are not intended to be limiting, with the true scope and spirit being indicated by the claims.

The invention claimed is:

1. A composite battery enclosure with electromagnetic shielding properties comprising:
   a. a molded top composite cover comprising
      i. a first core sandwiched between a first top composite cover skin and a second top composite cover skin;
   b. a molded bottom composite cover comprising
      i. a second core sandwiched between a first bottom composite cover skin and a second bottom composite cover skin,
      wherein at least one of the first top composite cover skin, the second top composite cover skin, the first bottom composite cover skin and the second bottom composite cover skin comprises a electromagnetic shielding resin matrix.

2. The composite battery enclosure of claim 1, wherein the electromagnetic shielding resin matrix further comprises fibers, wherein the fibers are inert and not electrically conducting.

3. The composite battery enclosure of claim 1, wherein the conductive filler comprises metal particles.

4. The composite battery enclosure of claim 1, wherein the conductive filler comprises carbon black, graphite, graphene, or mixtures thereof.

5. The composite battery enclosure of claim 1, wherein the at least one of the first top composite cover skin, the second top composite cover skin, the first bottom composite cover skin and the second bottom composite cover skin comprising the electromagnetic shielding resin matrix further comprises fibers, wherein the fibers are inert and not electrically conducting.

6. The composite battery enclosure of claim 5, wherein the electromagnetic shielding resin matrix comprises a blend of conductive fillers, the blend of conductive fillers comprising carbon black, carbon fibers, graphite, graphene, or a combination thereof.

7. The composite battery enclosure of claim 1, wherein at least one of the first core or the second core comprises the electromagnetic shielding resin matrix.

8. The composite battery enclosure of claim 7, wherein at least one of the first core or the second core is a honeycomb core material.

9. The composite battery enclosure of claim 1, wherein the electromagnetic shielding resin matrix comprising 0.5 to 5 weight percent of the conductive filler based on the total weight of the first top composite cover skin, the second top composite cover skin, the first bottom composite cover skin, or the second bottom composite cover skin that comprises the electromagnetic shielding resin matrix.

10. The composite battery enclosure of claim 1, wherein at least one of the first core or the second core comprises the electromagnetic shielding resin matrix, the electromagnetic shielding resin matrix comprising 0.5 to 10 weight percent of the conductive filler based on the total weight of the first core or the second core that comprises the electromagnetic shielding resin matrix.

11. A composite battery enclosure with electromagnetic shielding properties comprising:
   a. a molded top composite cover comprising
      i. a first core sandwiched between a first top composite cover skin and a second top composite cover skin;

b. a molded bottom composite cover comprising
   i. a second core sandwiched between a first bottom composite cover skin and a second bottom composite cover skin
     wherein at least one of the first top composite cover skin, the second top composite cover skin, the first bottom composite cover skin and the second bottom composite cover skin comprises a layer of electromagnetic shielding material.

12. The composite battery enclosure of claim 11, wherein the conductive filler comprises at least one of metal particles, the metal particles being selected from the group consisting of steel, aluminum, copper, zinc, nickel, lead, silver, gold and mixtures thereof, carbon black, graphite, graphene and conductive carbon fibers.

13. The composite battery enclosure of claim 11, wherein at least one of the first core or the second core comprises the layer of electromagnetic shielding material.

14. A composite battery enclosure with electromagnetic shielding properties comprising:

a. a molded top composite cover comprising
   i. a first core sandwiched between a first top composite cover skin and a second top composite cover skin;
b. a molded bottom composite cover comprising
   i. a second core sandwiched between a first bottom composite cover skin and a second bottom composite cover skin,
wherein the first core and the second core comprises a low density, crushable core that deforms upon impact, the first core and the second core comprising a honeycomb core;
wherein at least the first core or the second core comprises an electromagnetic shielding resin matrix, the electromagnetic shielding resin matrix comprising a conductive filler, the conductive filler comprises at least one of metal particles, the metal particles being selected from the group consisting of steel, aluminum, copper, zinc, nickel, lead, silver, gold and mixtures thereof, carbon black, graphite, and graphene.

\* \* \* \* \*